United States Patent [19]

Piotrowski

[11] Patent Number: 4,997,628
[45] Date of Patent: Mar. 5, 1991

[54] WEB GROWTH CONFIGURATION FOR HIGHER PRODUCTIVITY AND 100% FEED RATE CAPABILITY AT WIDE WIDTHS

[75] Inventor: Paul A. Piotrowski, Monroeville, Pa.

[73] Assignee: Westinghouse Electric Corp., Pittsburgh, Pa.

[21] Appl. No.: 397,823

[22] Filed: Aug. 24, 1989

[51] Int. Cl.⁵ .................. C30B 15/34; C30B 35/00
[52] U.S. Cl. ........................ 422/249; 156/DIG. 84; 156/620.1
[58] Field of Search ............ 156/617.1, 619.1, 620.1, 156/DIG. 84, DIG. 88; 422/245, 246, 248, 249

[56] References Cited

U.S. PATENT DOCUMENTS

| | | | |
|---|---|---|---|
| 4,028,059 | 6/1977 | LaBelle, Jr., et al. | 156/620.1 |
| 4,428,783 | 1/1984 | Gessert | 156/608 |
| 4,751,059 | 6/1988 | McHugh et al. | 156/DIG. 88 |
| 4,786,479 | 11/1988 | Hundal et al. | 422/245 |
| 4,828,808 | 5/1989 | Duncan et al. | 422/249 |

OTHER PUBLICATIONS

Seidensticker et al., *Journal of Crystal Growth* 50(1980), pp. 221-235.

Primary Examiner—Gary P. Straub
Assistant Examiner—Stephen G. Kalinchak

[57] ABSTRACT

A new lid and shield configuration for use in growing silicon dendritic web crystals is disclosed. The arrangement includes a plurality of spaced apart shields stacked above a lid having a slot therein through which dendritic web crystals are pulled. The shields also have slots in them, each successive shield having a slot slightly larger than that of the shield beneath it. The result is the ability for 100% melt replenishment plus increased productivity.

12 Claims, 4 Drawing Sheets

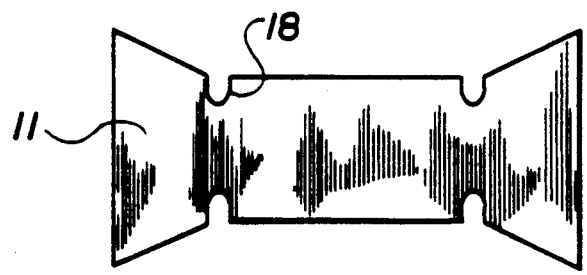
FIG. 2
FIG. 3
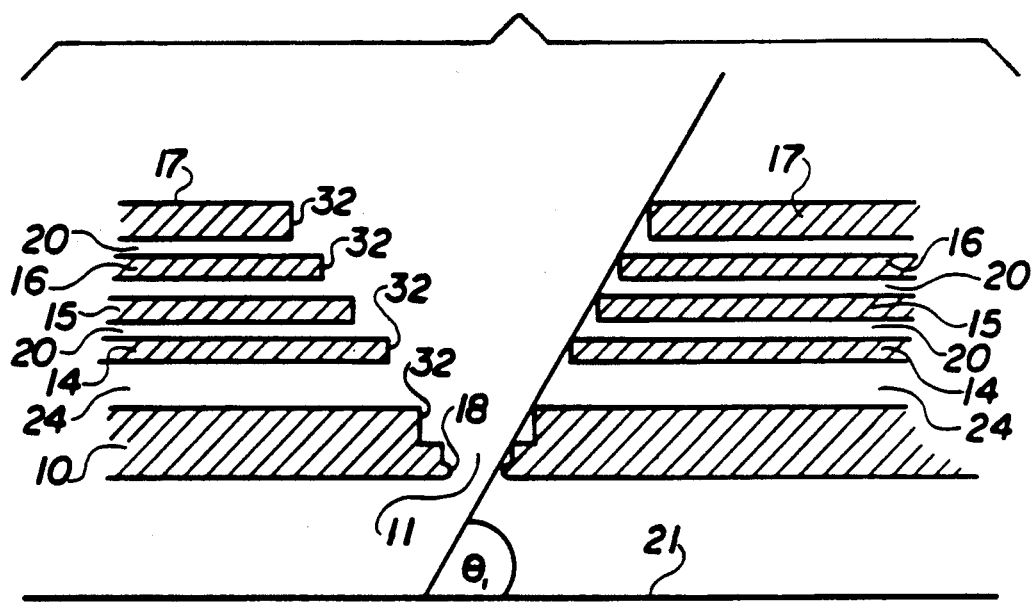

WEB GROWTH CONFIGURATION FOR HIGHER PRODUCTIVITY AND 100% FEED RATE CAPABILITY AT WIDE WIDTHS

FIELD OF THE INVENTION

The present invention relates to apparatus used for growing dendritic web crystals, and more specifically relates to susceptor lid and shield configurations used for growing silicon dendritic web crystals.

BACKGROUND OF THE INVENTION

Silicon dendritic web crystals are long, thin ribbons of single crystaline material of high structural quality which are grown in the (111) orientation. The current impetus for developing silicon dendritic web crystals are their application to the production of low cost, highly efficient solar cells for direct conversion of sunlight into electrical energy. The thin ribbon form of the crystal requires little additional processing prior to device fabrication, in contrast to wafer substrates from the more traditional Czochralski crystal which must be sliced, lapped and polished prior to use, a costly process even though large volume economies are practiced. Additionally, the rectangular shape of the silicon ribbon leads to efficient packing of individual cells into large modules and arrays of solar cells. For more information concerning techniques of growing dendritic web crystals, see Seidensticker, "Dendritic Web Growth of Silicon," Crystals 8 p. 146–172 (1982), incorporated by reference herein.

An important aspect of successful dendritic web crystal growth is the configuration of the shields and the lid used to cover the hot silicon melt. In the past, lids having a so-called "dog bone" shaped slots have been used with some success. Such lids also typically include a pair of outboard holes spaced a predetermined distance from the ends of the slot. See U.S. Pat. No. 4,751,059, incorporated by reference herein. These outboard holes assist in maintaining the growing dendritic web crystal at a constant width. More recently, the dog bone shaped slot has been replaced with the so-called "bowtie" shaped slot as disclosed in my co-pending application Ser. No. 07/092,796 now U.S. Pat. No. 4,828,808. Additionally, U.S. Pat. No. 4,786,479 discloses the use of sublids to control heat radiation.

While these lid configurations have proven effective, they have been unable to achieve 100% feed rate capability combined with high productivity. For example, in the bowtie configuration disclosed in my co-pending application Ser. No. 07/092,796now U.S. Pat. No. 4,828,808, a production rate of only 6.2 cm$^2$/min. was obtained at 100% feed rate capability.

As used herein the term "100% feed rate capability" means that the molten material (such as silicon) contained by the susceptor is being replaced at the same rate the material is being withdrawn by virtue of the growing dendritic web being pulled from the melt. In the past, replenishment of the melt at 100% feed rate caused "ice" formation in the melt because of the cooler replenishment pellets being dropped therein. This in turn resulted in decreased productivity to the point where only about 75% of feed rate capability could be achieved before nucleation or "ice" formation occurred.

Other configurations have produced up to 7.4 cm$^2$/min. production rate, at the expense of achieving only 75% feed rate capability. Accordingly, it would be useful to achieve 100% feed rate capability while simultaneously achieving high production rates of crystal growth.

SUMMARY OF THE INVENTION

The present invention utilizes a newly designed lid and shield configuration which permits improved removal of radiant heat from the surface of a widening dendritic web, thereby making the web grow thicker than was previously possible. The resultant thicker web permits a higher system temperature so that 100% feed rate capability is achievable at high production rates. Specifically, production rates of 8.9 cm$^2$/min. at 100% feed rate capabililty have been achieved.

The new lid configuration includes a plurality of shields placed above the lid, each shield having a slot therein through which the dendritic web crystals are pulled. The slot in each shield is designed to be positioned substantially concentrically with respect to the slot in the lid, and each slot in each shield is slightly larger than the slot in the shield directly beneath. The result is the ability to remove radiant heat more quickly from the surface of the widening web, which makes the web grow thicker, permitting the system temperature to be increased, which in turn allows for 100% feed rate capability and thereby results in higher production rates.

A preferred embodiment of the present invention further includes web guides in the susceptor lid, which permit the dendritic web to grow and be pulled substantially through the center of the slot in the lid.

Other details, objects and advantages of the invention will become apparent as the following description of the presently preferred embodiments and presently preferred methods of practicing the invention proceeds.

BRIEF DESCRIPTION OF THE DRAWINGS

In the accompanying drawings, the preferred embodiments of the invention and preferred methods of practicing the invention are illustrated in which:

FIG. 2 illustrates a schematic plan view of a preferred lid slot having web guides used in connection with the present invention.

FIG. 3 illustrates a cross-sectional elevation view of a preferred lid and shield arrangement of the present invention, taken along lines III—III of FIG. 1.

DETAILED DESCRIPTION OF THE PREFERRED EMBODIMENTS OF THE INVENTION

Figure 1:
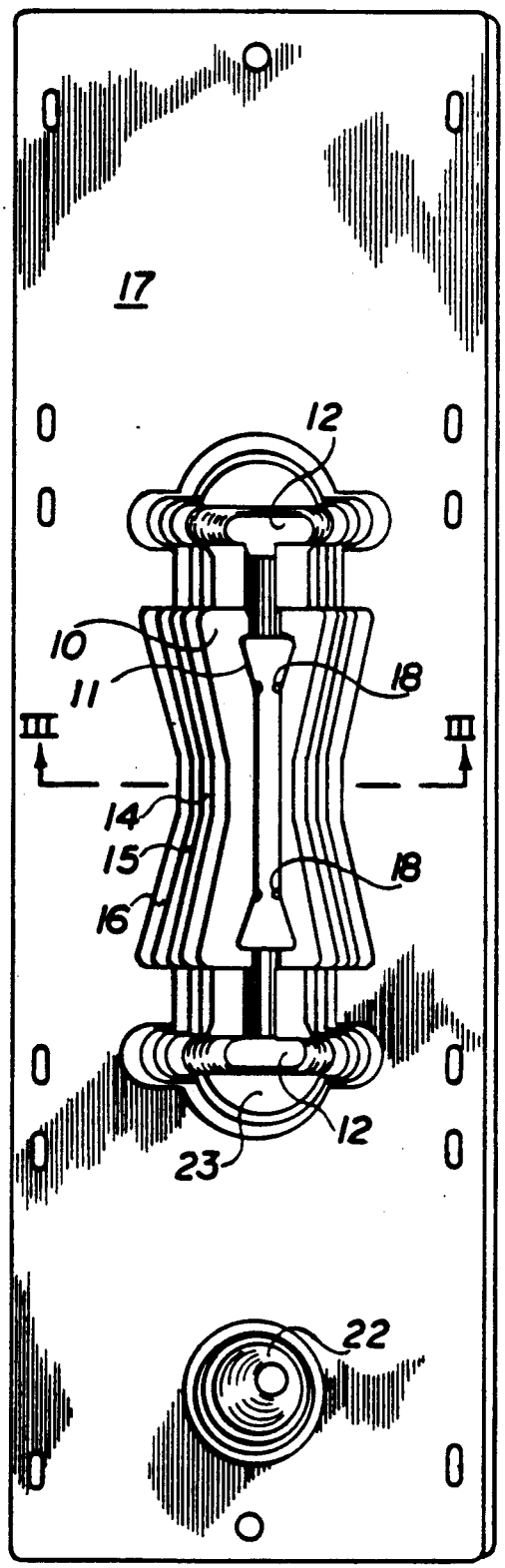
FIG. 1 illustrates a plan view of a preferred embodiment of the present invention with lid and stacked shields having increasingly sized slot openings.

FIG. 1 illustrates a preferred embodiment of the present invention, wherein a susceptor lid for growing silicon dendritic web crystals generally 10, has a slot 11 therein, through which the dendritic web crystals may be pulled. The slot 11 may be of any configuration, although the bowtie-shaped configuration illustrated has proven most effective. Also as shown in FIG. 1, the ends of the slot 11 include outboard openings 12, which assist in maintaining constant web width.

As further illustrated in FIG. 1, the arrangement includes a plurality of shields 14–17 placed directly above the lid 10. The lowermost shield 14, rests on the lid 10 and has a slot which is positioned substantially concentrically with respect to the slot 11 in the lid 10. As illustrated, the slot in the lowermost shield 14 is slightly larger than the slot 11 in the shield 10. Preferably, the width of the slot in the shield 14 is slightly wider than the width of the slot 11 of the lid 10, although the length of the slot in the shield 14 is preferably substantially the same as the length of the slot in the lid 10, with the exception of those shields having outwardly bowed portions 23, to be described later.

Similarly, the shield 15 has a slot which is positioned substantially concentrically with respect to the slot in the shield 14. The shield 15 is positioned directly above the shield 14. The slot in the shield 15 is slightly wider than the slot in the shield 14. Likewise, the shield 16 is positioned directly above the shield 15 and has a slot therein which is positioned substantially concentrically with respect to the slot in the shield 15. Also, the slot in the shield 16 is slightly wider than the slot in the shield 15 as illustrated.

Preferably, one of the shields of the arrangement comprises a top plate 17 which is positioned above the shields 14–16, and also has a slot therein. As with the shield slots, the slot in top plate 17 is similarly positioned substantially concentrically with respect to the slots in the shields, and the top plate slot is wider than the slots in the shields.

As illustrated in FIGS. 1-3, the lid slot 11 may include a plurality of web guides 18, which permit the dendritic web crystals being grown through the slot to be pulled substantially through the center of the slot 11. In this way, the web is prevented from migrating back and forth in the slot, which occassionally results in the web touching the sides of the lid slot, which can cause crystal failure as a result of improper heat transfer with respect to the growing web. The web guides 18 are preferably machined directly into the lid 10. Most preferably, the web guides 18 are positioned near the lower surface of the lid 10, as illustrated in FIG. 3. In this way, the web guides are kept sufficiently hot to prevent the formation of $SiO_x$ thereon. Preferably, the web guides have small rounded tips as illustrated.

In a preferred embodiment of the invention, the shields are fabricated of sintered molybdenum, and are 0.06 inches thick. The top lid 17 is preferably 0.125 inches thick and the lid 10 is preferably 0.500 inches thick.

FIG. 3 illustrates a cross-sectional elevation view of the arrangement taken along the lines AA of FIG. 1. As illustrated, shields 14–16, and top plate 17 are separated from one another by a space generally 20, which space is preferably about 1/16 of an inch. The lowermost shield 14 is preferably separated from the lid 10 by a space 24 of about 3/16 of an inch. These spaces 20 and 24 are provided by positioning spacer means of the appropriate thickness, such as molybdenum washers, (not shown), between successive shields and/or the lid 10 and lowermost shield 14. The lid 10 has a double step as illustrated in FIG. 3 which forms the slot 11. Each step in the lid is preferably 0.250 inches high. Also as illustrated in FIG. 3, the slots in the lid 10, shields 14–16, and top plate 17 are offset and widen upwardly, preferably creating an angle $\Theta_1$ of about 30° with respect to a horizontal melt 21 over which the lid, shields and top plate are placed, (or 60° with respect to the vertical). Increasing this angle $\Theta_1$ above 30° relative to the horizontal melt 21 decreases the amount of heat loss from the growing web while decreasing this angle $\Theta_1$ below 30° relative to the horizontal melt 21 increases the heat loss. The preferred offset angle $\Theta_1$ provides the appropriate amount of heat loss to permit 100% feed rate capability, while simultaneously preventing $SiO_x$ deposition on the growing web.

As illustrated in FIG. 1, the lid and shield configuration of the present invention preferably further includes a feed port 22. Feed materials, such as silicon pellets are dropped through this feed port, to replenish the depleted melt caused by the growing web crystal. As further illustrated in FIG. 1, the feed port holes in the series of shields may be designed to fit concentrically over the feed port in the lid 22 and may similarly be sized to be progressively larger than the hole in the lid or shield directly below. The feed port 22 is preferably defined by holes in the lid and shields which increase in size at an angle of about 30° to the horizontal or 60° to the vertical, in order to prevent oxide formation within the feed port 22.

Preferably, the silicon pellets are cube shaped, having a size of 0.090 inches on edge. Such cubes can be prepared by sawing 0.090 inch thick silicon with a diamond blade saw. Alternatively, round silicon shot pellets may be used.

The slot configuration illustrated in FIG. 1 includes the so-called "T-shaped" outboard openings 12 and the slots in the shields are shaped to fit concentrically with respect to these outboard openings 12. As illustrated, these outboard openings 12, as defined by successive shields 14–16 placed above the lid 10, may include outwardly bowed portions 23 which assist in further heat radiation from the ends of the growing web.

The newly configured lid and shield arrangement of the present invention allows the release of radiant heat from the surface of a widening and growing dendritic web crystal, thereby making the web itself grow thicker. The resultant thicker web permits a higher system temperature than would otherwise be possible, which results in the ability to achieve 100% feed rate capability. Specifically, using the lid and shield configuration of the present invention, silicon dendritic web crystals having a web width of 5.7 centimeters were obtained at 100% feed rate capability and at a production rate of 8.9 cm²/min.

Figure 4:
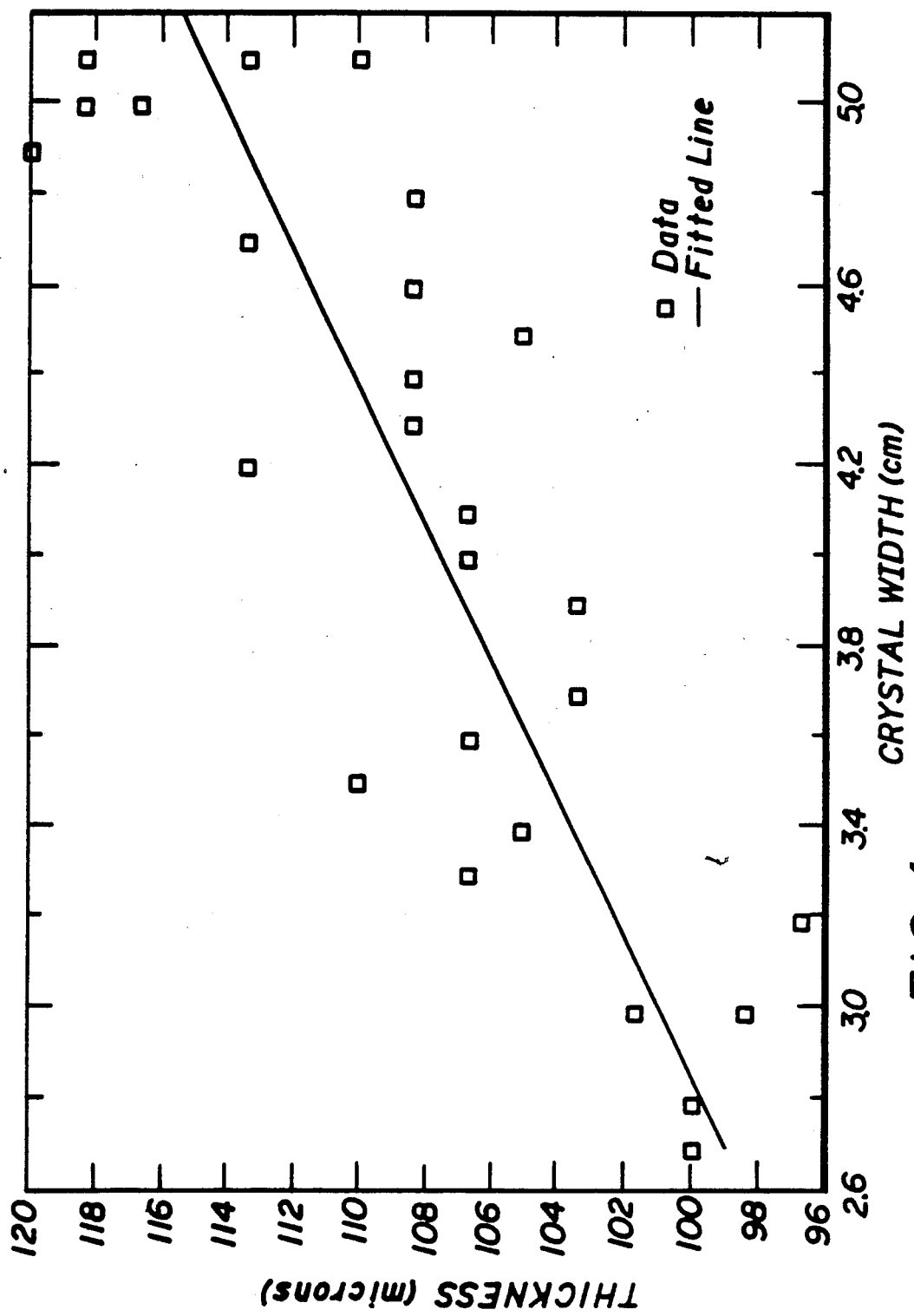
FIG. 4 illustrates a plot of web thickness vs. crystal width for dendritic web crystals produced using a preferred lid and shield configuration of the present invention.

FIG. 4 illustrates a plot of web thickness vs. crystal width for crystals grown through the lid/shield configuration of the present invention.

Table 1 below represents a comparison of performance results for dendritic web crystals grown through the lid and shield arrangement of the present invention (6355-L5) vs. dendritic web crystals grown under identical conditions through a lid and shield configuration taught in copending application Ser. No. 07/092,796 and illustrated in FIG. 5 of that application (6342-L5).

TABLE 1

BEST PERFORMANCE RESULTS
(46 runs each configuration)

|  | 6355-L5 | vs | 6342-L5 |
|---|---|---|---|
| Percent of uptime Growing Crystals | 82% |  | 63% |
| Max. Crystal Length | 11.98 meters |  | 5.40 meters |
| Mean Crystal Length | 4.06 meters |  | 2.32 meters |
| Max. Crystal Width | 5.7 cm |  | 5.5 cm |

TABLE 1-continued

BEST PERFORMANCE RESULTS
(46 runs each configuration)

|  | 6355-L5 | vs | 6342-L5 |
|---|---|---|---|
| Max. Thruput 168 hrs. | 51,000 cm$^2$ |  | 16,000 cm$^2$ |
| Avg. Percent Feed | 100% |  | 57% |

Figure 5:
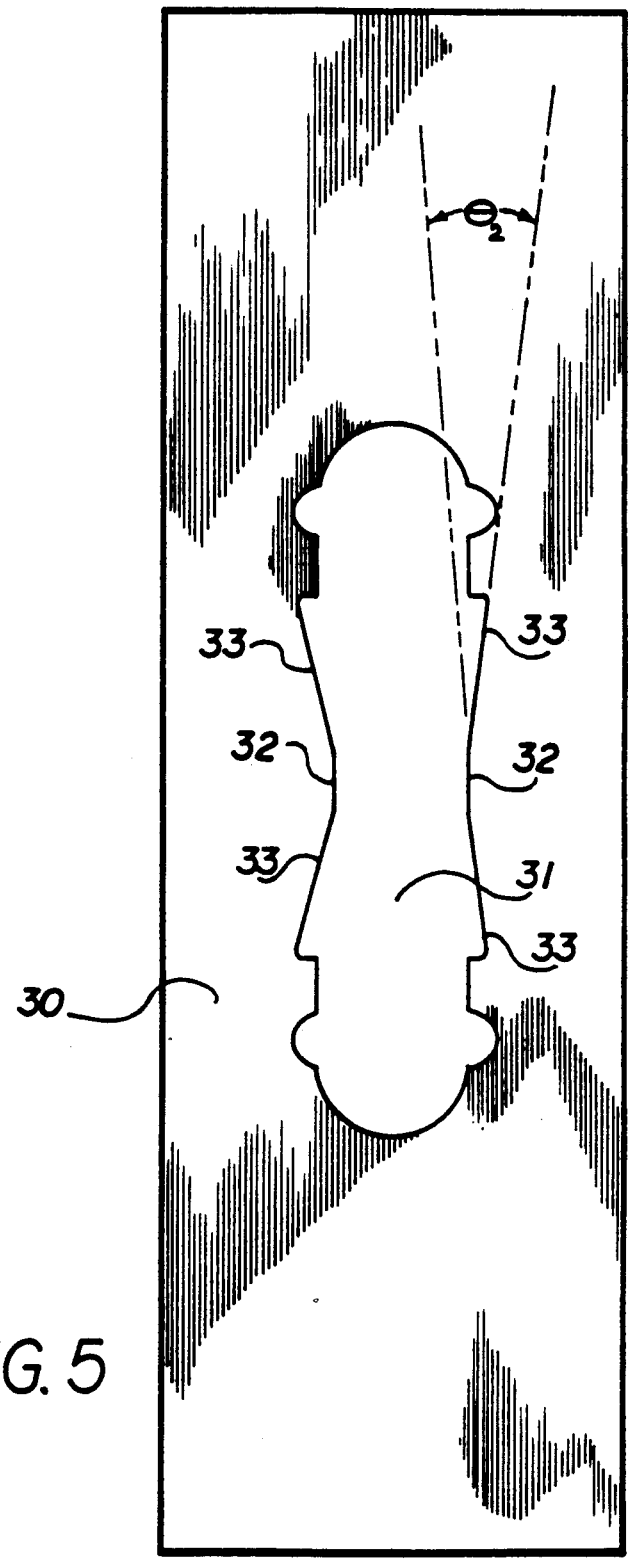
FIG. 5 illustrates a schematic plan view of a preferred shield of the present invention.

These unexpectedly improved web growth results were made possible as a result of the unique lid and shield design of the present invention. FIG. 5 illustrates a shield 30 having a slot 31. According to the present invention, the slot 31 has a narrow parallel portion 32 located at substantially the longitudinal center of the slot 31. This narrow parallel portion 32 is considerably shorter than parallel portions illustrated in copending application Ser. No. 07/092,796. Preferably, the narrow parallel portion 32 is about 1.000 inches long. The slot 31 also has four outwardly angled portions 33, which form an angle $\Theta_2$ with respect to the narrow parallel portions 32 as illustrated. Preferably, this angle $\Theta_2$ is about 22° relative to portions 32.

Preferably, each slot in successive lids/shields has a narrow parallel portion 32 which is the same length as the narrow parallel portion 32 of each other shield/lid. However, as illustrated in FIG. 3, each shield above the lid 10 has its narrow parallel portion 32 offset from that of the shield or lid directly therebeneath, such that the slot widths increase with each successive shield placed above the lid.

Similarly, the outwardly angled portions 33 of each shield are substantially parallel to and offset from the outwardly angled portions 33 of the shield or lid directly there beneath, as illustrated in FIG. 5.

Although the invention has been described in detail in the foregoing for the purpose of illustration, it is to be understood that such detail is solely for that purpose and that variations can be made therein by those skilled in the art without departing from the spirit and scope of the invention as defined by the following claims.

I claim:

1. A susceptor lid and shield arrangement for use in growing dendritic web crystals therethrough, said lid having a bowtie shaped slot through which said dendritic web crystals may be pulled, said bowtie shaped lid slot having a plurality of web guides located at the apexes of the bowtie at the longitudinal parallel portions of said slot, and protruding towards the crystal being pulled, said web guides comprising rounded protuberances, said arrangement including a plurality of shields positioned above said lid, one of said shields comprising a lowermost shield, said lowermost shield resting on said lid and having a slot therein, said lowermost shield slot being positioned substantially concentrically with respect to said bowtie shaped slot in said lid, said lowermost shield slot being larger than said bowtie shaped slot in said lid, each additional said shield being positioned above one of said shields and having a slot being positioned substantially concentrically with respect to said bowtie shaped slot in said lid and each said slot in each other said shield, said shields being positioned above one another in order of increasing slot size, such that each said shield has a slot which is larger than the slot of the shield directly therebeneath.

2. The arrangement of claim 1 further including a top plate positioned above said plurality of shields, said top plate having a slot therein, said slot being positioned substantially concentrically with respect to said slots in said shields, said top plate slot being larger than said slots in said shields.

3. The arrangement of claim 1 wherein said shields are 0.06 inches thick and spaced apart from one another by a distance of about 1/16 inch.

4. The arrangement of claim 1 wherein said shields are fabricated of sintered molybdenum.

5. A susceptor lid and shield arrangement for use in growing dendritic web crystals therethrough, said lid having a bowtie shaped slot through which said dendritic web crystals may be pulled, said bowtie shaped lid slot having a plurality of web guides located at the apexes of the bowtie at the longitudinal parallel portions of said slot, and protruding towards the crystal being pulled, said web guides comprising rounded protuberances, said arrangement including a plurality of shields positioned above said lid, said plurality of shields including a first shield positioned directly above said lid, said first shield having a slot therein, said first shield slot being positioned substantially concentrically with respect to said bowtie shaped slot in said lid, said first shield slot width being larger than the width of said bowtie shaped slot in said lid, said plurality of shields further including a second shield positioned above said first shield, said second shield having a slot therein, said second shield slot being positioned substantially concentrically with respect to said first shield slot, said second shield slot width being larger than said first shield slot width, said plurality of shields further including a third shield positioned above said second shield, said third shield having a slot therein, said third shield slot being positioned substantially concentrically with respect to said second shield slot, said third shield slot being larger than said second shield slot.

6. The arrangement of claim 5 further including a top plate positioned above said plurality of shields, said top plate having a slot therein, said slot being positioned substantially concentrically with respect to said slots in said shields, said top plate slot being larger than said slots in said shields.

7. The arrangement of claim 5 wherein said shields are 0.06 inches thick and spaced apart from one another by a distance of about 1/16 inch.

8. The arrangement of claim 5 wherein said shields are fabricated of sintered molybdenum.

9. The arrangement of claim 5 wherein said slots in said shields are progressively increased in size so as to create an angle with respect to a horizontal melt over which said shields are placed, said angle being about 30°.

10. The arrangement of claim 6 wherein said bowtie shaped slot, each slot in said shields, and said slot in said top plate each includes a centrally disposed parallel portion having outwardly angled portions extending therefrom, said outwardly angled portions forming an angle of about 22° relative to said narrow parallel portion.

11. The arrangement of claim 10 wherein said parallel portion of said lid, shields and top plate is substantially the same length with respect to each other parallel portion in said lid, shields and top plate.

12. The arrangement of claim 11 wherein said outwardly angled portions of each said shield and said top plate are substantially parallel to the outwardly angled portion of said lid and shields.

* * * * *